United States Patent
Kashiwagi et al.

(10) Patent No.: US 6,446,333 B1
(45) Date of Patent: Sep. 10, 2002

(54) METHOD OF MOUNTING A PLURALITY OF ELECTRONIC COMPONENTS

(75) Inventors: Yasuhiro Kashiwagi; Kazuhide Nagao, both of Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 147 days.

(21) Appl. No.: 09/629,221

(22) Filed: Jul. 31, 2000

(30) Foreign Application Priority Data

Aug. 6, 1999 (JP) .......................................... 11-223402

(51) Int. Cl.$^7$ ................................................ H05K 3/30
(52) U.S. Cl. ........................... 29/833; 29/836; 29/740; 29/743; 29/721; 29/759; 29/DIG. 44; 356/614; 250/559.19; 198/395
(58) Field of Search ......................... 29/832, 833, 834, 29/836, 837, 739, 740, 741, 743, 744, DIG. 44, 721, 759; 356/614, 622, 394; 250/559.19; 198/395

(56) References Cited

U.S. PATENT DOCUMENTS

| | | | | |
|---|---|---|---|---|
| 4,812,666 A | * | 3/1989 | Wistrand | 250/559.19 |
| 4,951,383 A | * | 8/1990 | Amao et al. | 29/721 |
| 5,200,799 A | * | 4/1993 | Maruyama et al. | 356/394 |
| 5,420,691 A | * | 5/1995 | Kawaguchi | 29/759 |
| 5,699,448 A | * | 12/1997 | Gorenflo et al. | 29/834 |
| 6,144,452 A | * | 11/2000 | Hachiya | 356/614 |
| 6,211,958 B1 | * | 4/2001 | Hachiya et al. | 29/759 |

\* cited by examiner

*Primary Examiner*—Rick K. Chang
(74) *Attorney, Agent, or Firm*—Ratner & Prestia

(57) ABSTRACT

A component mounting method for picking up components with a mounting head having multiple suction nozzles, and mounting these components on a mounting target after recognition. Components picked up integrally move against a component recognizer disposed on a movement route of the head for scanning and recognizing each component. During scanning, the slowest speed in scanning speeds required for recognizing each component is used. This eliminates a approaching time needed for switching speed during scanning of each component, thus reducing the total recognition time to improve mounting efficiency.

6 Claims, 4 Drawing Sheets

METHOD OF MOUNTING A PLURALITY OF ELECTRONIC COMPONENTS

FIELD OF THE INVENTION

The present invention relates to component mounters and mounting methods such as for mounting electronic components on substrates.

BACKGROUND OF THE INVENTION

Component mounters, typically for mounting electronic components, pick up components stored in a feeder carriage using a mounting head with a suction nozzle, and transfer them to a target substrate to mount on predetermined mounting points. Before mounting components on the substrate, each component is visually recognized to identify its type and to detect any positional deviation.

This recognizing operation takes place before mounting, typically in the following way. A camera captures an image of a component held by the mounting head from underneath. A line camera is often used as means of capturing component images. The line camera is equipped with a line sensor comprising numerous CCD elements aligned in one dimension. The target object whose image is to be captured is passed over the line sensor and scanned, generating two-dimensional image data.

This type of conventional component mounter and mounting method often employs two or more suction nozzles on the mounting head to improve the mounting efficiency. These multiple nozzles on the head pick up required components from each parts feeder in the feeder carriage according to the mounting sequence, and pass the component over the camera for image capture and recognition of each component.

The above line camera has the following disadvantage of recognizing multiple components held by multiple suction nozzles.

The line camera recognizes components by scanning a target component to obtain a two-dimensional image from a set of one-dimensional images. An appropriate scanning speed for each target component exists for capturing an image at satisfactory resolution. Accordingly, when the camera continuously scans multiple components held by multiple suction nozzles, the scanning speed needs to be changed for each component.

The scanning speed of the line camera for each component in the conventional electronic component mounting method is described next with reference to FIG. 4.

FIG. 4 is a graph illustrating changes in the scanning speed when capturing an image, i.e., the horizontal movement speed of the mounting head during capture of the image in the conventional electronic component mounting method. In FIG. 4, V1, V2, and V3 are appropriate scanning speeds for respective electronic components (110, 120, and 130 in FIG. 3). Here, their relations are V3>V1>V2.

It is apparent from the graph that the horizontal movement speed of the mounting head is switched to achieve the scanning speeds V1, V2, and V3 suitable for each component when capturing images of the components 110, 120, and 130. In addition, a predetermined approaching time is required when switching the speed to obtain a stable scanning speed. In order to capture images at stable scanning speed for all three components, three steps of approaching times T1, T2, and T3 are required to be set.

Consequently, the total scanning time T is greatly prolonged because these approaching times are added to the net image capturing time resulting in much reduced recognition efficiency. The conventional component mounting method requires a different scanning speed to be set for each electronic component in order to recognize each component while continuously moving multiple components. Accordingly, the total scanning time T becomes longer, reducing recognition efficiency.

SUMMARY OF THE INVENTION

The present invention aims to offer a component mounter and mounting method which reduces recognition time and improves mounting efficiency for recognizing images of each component while moving multiple components continuously.

The component mounter of the present invention comprises the following:
  (a) a component feeder carriage;
  (b) a mounting head with several suction nozzles for picking up components from the feeder carriage; and
  (c) a recognizer disposed on a movement route of the mounting head for recognizing components.

Components picked up are scanned at the slowest speed required for recognizing each component while relatively moving these components integrally against the recognizer. After recognizing each of these components, these are mounted on a mounting target (such as a substrate).

The above configuration eliminates the need of approaching time after switching the speed for scanning each component, reducing the total recognition time to realize highly efficient component mounter.

The component mounting method of the present invention comprises the following steps:
  (a) picking up components from the component feeder carriage by several suction nozzles provided on the mounting head;
  (b) recognizing each component with the recognizer by relatively moving each component picked up integrally at a predetermined speed against the recognizer disposed on the movement route of the mounting head; and
  (c) mounting each component on a mounting target.

The above predetermined speed is the slowest speed in scanning speeds required for recognizing each component picked up.

Another mounting method of the present invention comprises the next steps:
  (a) picking up components from the feeder carriage by several suction nozzles provided on the mounting head;
  (b) calculating scanning speed for recognizing each component picked up;
  (c) identifying the slowest speed in these calculated scanning speeds;
  (d) scanning these components integrally against the recognizer disposed on the movement route of the mounting head at the above slowest speed by moving the mounting head;
  (e) recognizing each component during scanning; and
  (f) mounting each component on a mounting target.

This method integrally moves multiple components relative to the recognizer for scanning at the slowest scanning speed in scanning speeds set for each component by relatively moving these components against the recognizer. This eliminates the approaching time required for switching the scanning speed for each component, reducing the total recognition time and achieving efficient component mounting.

DESCRIPTION OF THE PREFERRED EMBODIMENT

A preferred embodiment of the present invention is described below with reference to drawings.

Figure 1:
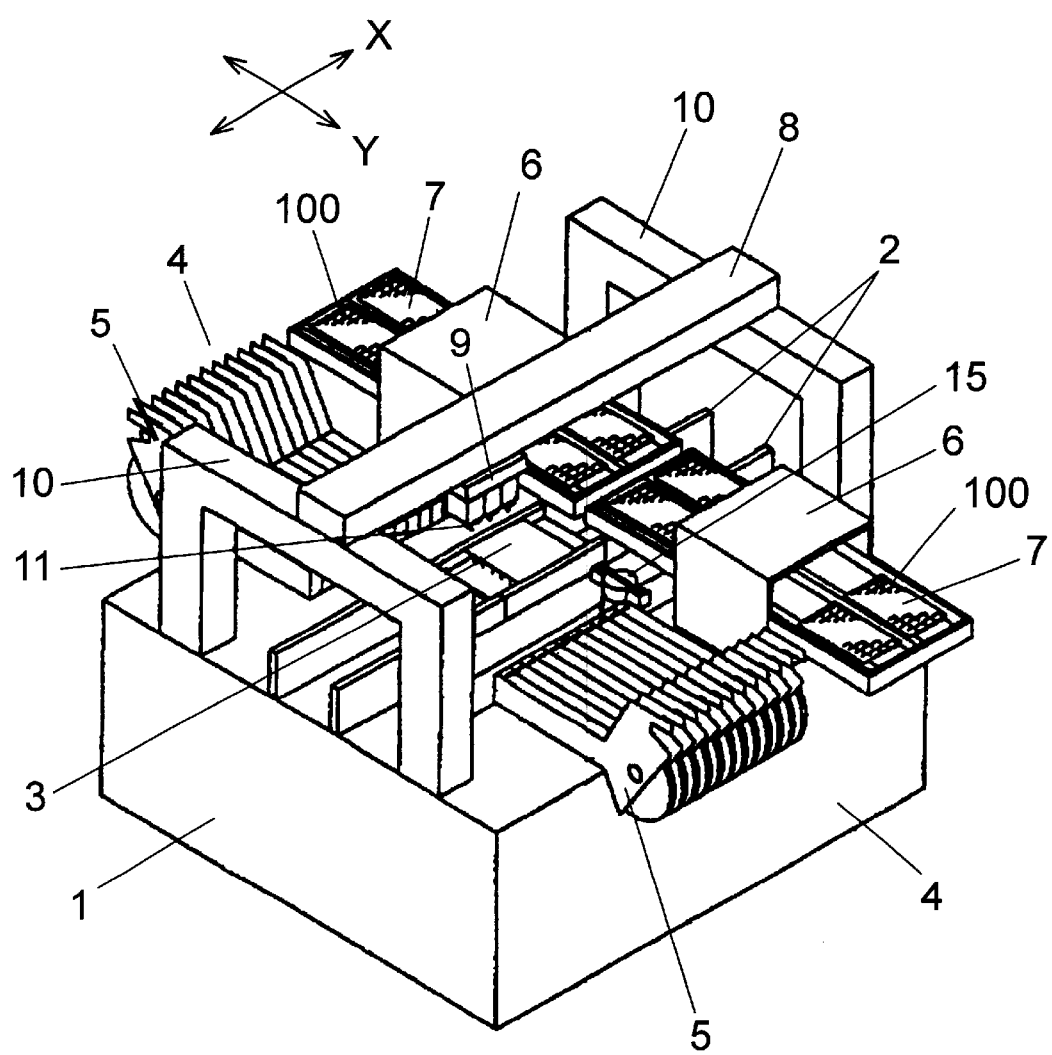
FIG. 1 is a perspective view of a component mounter in accordance with a preferred embodiment of the present invention.
Figure 2:
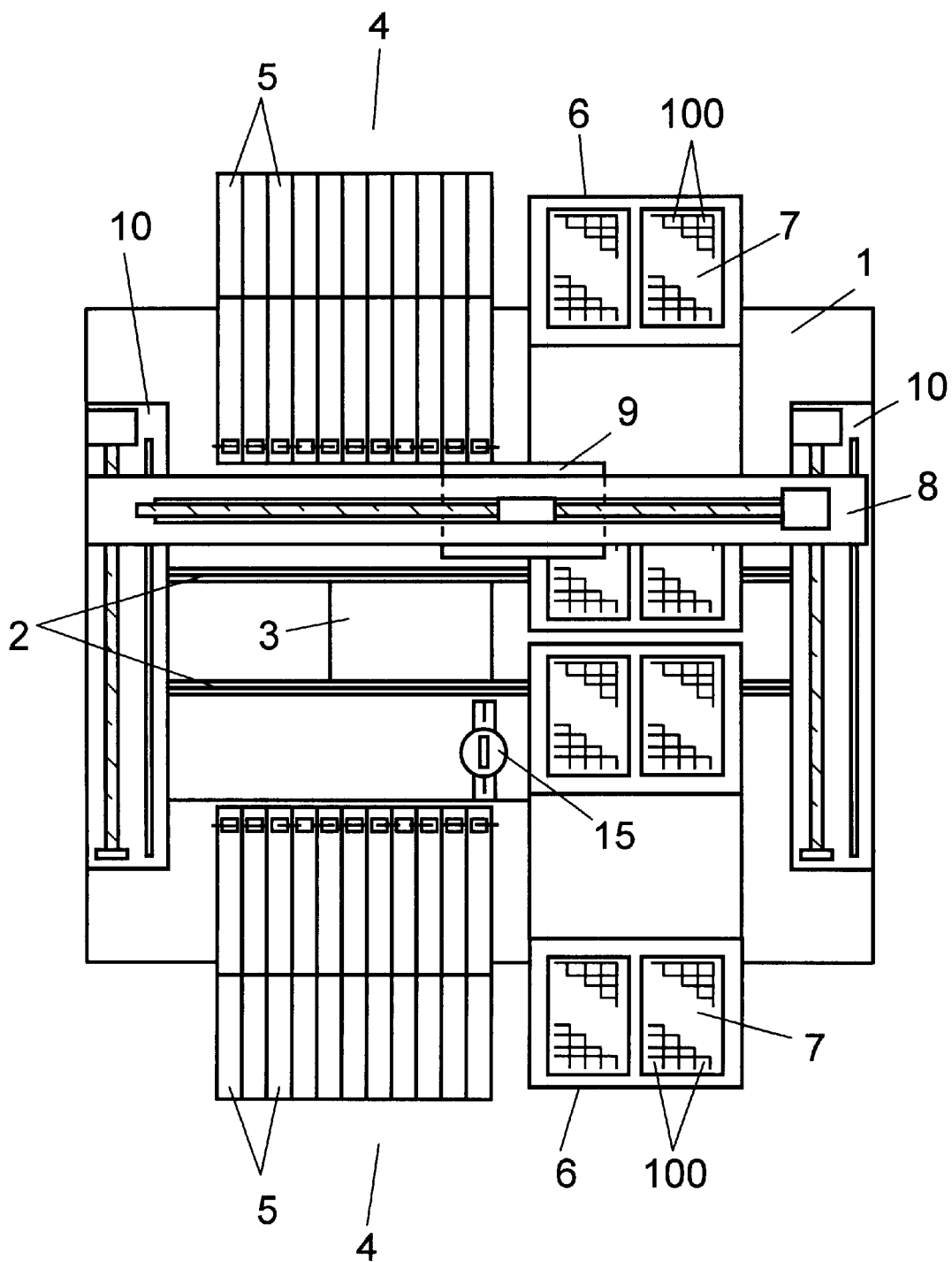
FIG. 2 is a plan view of the component mounter in accordance with the referred embodiment of the present invention.
Figure 3:
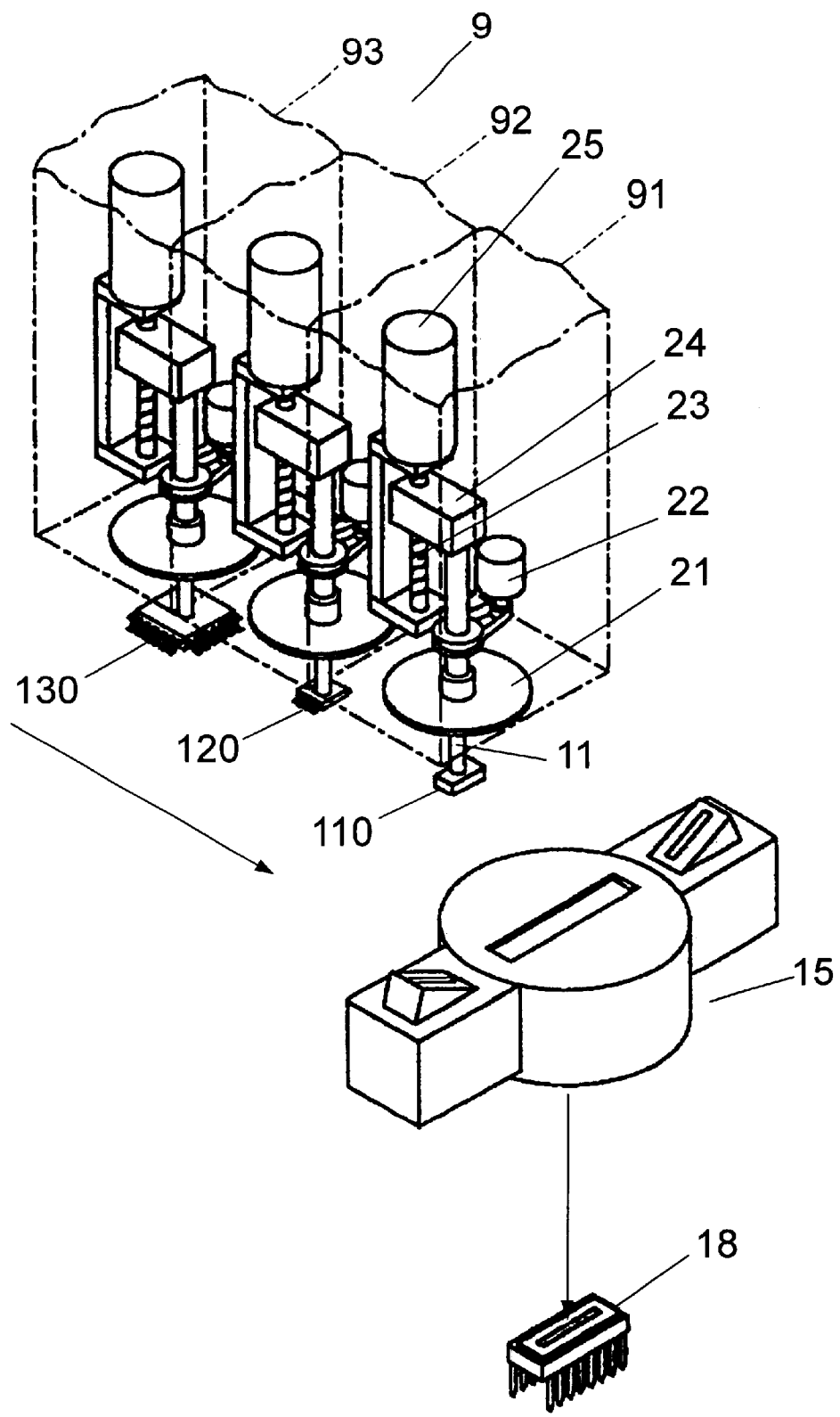
FIG. 3 is a fragmentary perspective view of the component mounter in accordance with the preferred embodiment of the present invention.

FIG. 1 is a perspective view, FIG. 2 is a plan view, and FIG. 3 is an exploded view of a component mounter in the preferred embodiment of the present invention.

First, the configuration of the component mounter in the preferred embodiment is described.

In FIG. 1, transfer rail 2 in the X direction is disposed at the center of base 1. Transfer rail 2 is a positioning unit for transferring and positioning substrate 3 onto which the components are to be mounted on. Feeder carriage 4 for components such as electronic components is disposed on both sides of transfer rail 2. Feeder carriage 4 has tape feeder 5 for supplying taped components and tray feeder 6 for supplying components 100 stored in tray 7.

Component mounting head 9 is attached to X-axis table 8. Mounting head 9 is a multi-nozzle type, and is provided with two or more suction nozzles 11. X-axis table 8 is disposed on a pair of parallel Y-axis tables 10. Mounting head 9 moves horizontally by driving X-axis table 8 and Y-axis tables 10. Suction nozzles 11 attached under head 9 pick up each component at the pickup position of tape feeder 5 and components 100 from predetermined tray 7 on tray feeder 5, and mount them on substrate 3 on transfer rail 2. In other words, head 9 picks up different types of components with multiple nozzles 11 for mounting. X-axis table 8 and Y-axis tables 10 are thus the transfer means of head 9.

Mounting head 9 is detailed next with reference to FIG. 3.

Head 9 is a three-series head comprising single mounting heads 91, 92, and 93. Each of the single heads 91, 92, and 93 has suction nozzle 11 for holding a component by suction. Each nozzle 11 has round reflector 21 for lighting the component picked up by nozzle 11, reflecting the light from the bottom light source.

Nozzle 11 rotates by X-axis motor 22, and is raised and lowered by driving feed screw 23 fitted to nut 24 by means of Z-axis motor 25.

Line camera 15 is disposed along the head movement route between transfer rail 2 and feeder carriage 4. The light entering the optical system of camera 15 is received by one-dimensional line sensor 18, while head 9 holding the component moves horizontally over camera 15, to recognize the component. FIG. 3 shows an example of three different types of electronic components 110, 120, and 130 being held by three heads 91, 92, and 93. Mounting head 9 is integrally moved in this state so that heads 91, 92, and 93 all pass over camera 15 for continuous capture and recognition of the images of components 110, 120, and 130.

Next, a mounting method of the component mounter of the present invention as configured above is described.

(a) Mounting head 9 picks up a component from feeder carriage 4. Here, Single mounting heads 91, 92, and 93 respectively pick up different types of components 110, 120, and 130.

(b) Head 9 moves over the line camera 15, and components 110, 120, and 130 held with heads 91, 92, and 93 horizontally move over the camera 15 integrally for recognition of each component.

(c) Each component is mounted on substrate 3.

In the above step (b), image capture for recognizing the three types of components 110, 120, and 130 are implemented as described below.

Figure 4:
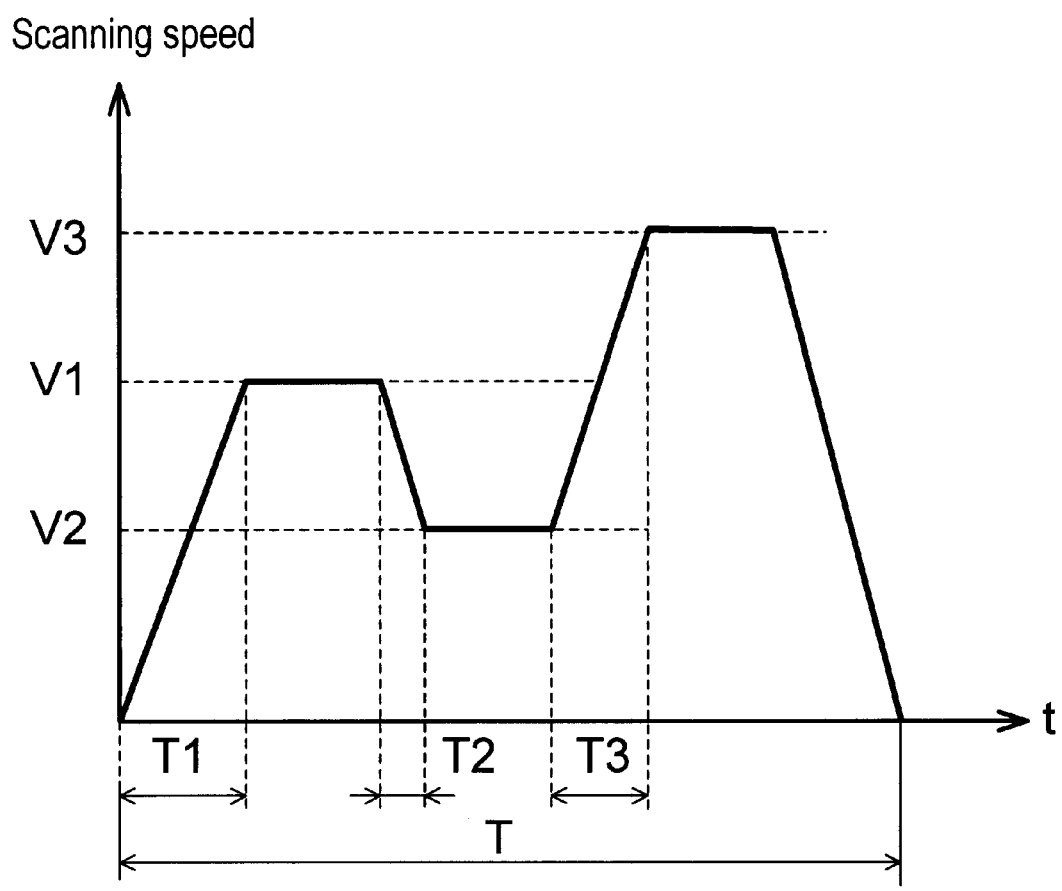
FIG. 4 is a graph illustrating scanning speed at capturing images in a conventional component mounting method.

First, the individual scan speeds for capturing images of each of components 110, 120, and 130 is identified. During recognition using the line camera, one-dimensional images obtained at each image recording timing during scanning are aligned in parallel to obtain two-dimensional images. Accordingly, it is important to set the scanning speed appropriately. In other words, the scanning speed needs to be set below a predetermined upper limit speed to obtain the predetermined resolution. This upper limit speed for achieving the required resolution is set at the appropriate scanning speeds V1, V2, and V3 in FIG. 4. These appropriate scanning speeds depend on the size and degree of shape complexity of each component. The appropriate scanning speed is thus different for each component when different types of components are held with three heads moving integrally as described above for recognition.

In this preferred embodiment, the slowest scanning speed Vm of the scanning speeds V1, V2, and V3 as identified above is obtained for moving three components integrally. The entire head 9 integrally moves relatively to camera 15 at this scanning speed Vm for continuously taking images of each of the components 110, 120, and 130.

In this method, images of all components 110, 120, and 130 are captured at the scanning speed below the upper limit speed determined by the required resolution. Accordingly, captured images always satisfy the level of resolution required. In addition, since the same scanning speed is used for the components, the relative speed between each component being scanned and camera 15 remains constant, eliminating the need for switching the speed. In other words, this system eliminates the need for the approaching times T1, T2, and T3 required in the conventional method shown in FIG. 4. The mounting method of the present invention thus reduces the overall time required for capturing the images of all types of components, and also reduces the tact time for component mounting, resulting in improved mounting efficiency.

It is apparent that the same effect is achievable if four or more suction nozzles are installed on the mounting head.

As described above, the present invention uses the slowest scanning speed as the scanning speed for each component during the process of capturing an image of each component by integrally moving multiple components relatively to the recognizer for scanning. This eliminates the approaching time required for switching speed while scanning each component in the prior art, resulting in improved mounting efficiency.

What is claimed is:

1. A component mounting method comprising:
   (a) picking up a plurality of different size components from a component feeder carriage by a plurality of suction nozzles on a mounting head;

(b) recognizing each of said components by a recognizer by integrally moving each of said components picked up relatively to said recognizer disposed on a movement route of said mounting head at a predetermined speed; and (c) mounting each of said components on a mounting target;

wherein said predetermined speed is a slowest speed in scanning speeds among said plurality of different size components required for recognizing each of said components picked up.

2. The component mounting method as defined in claim 1, wherein at least two of said suction nozzles pick up different types of components.

3. The component mounting method as defined in claim 1, wherein said mounting head has at least three of said suction nozzles, and said suction nozzles pick up at least three types of components.

4. The component mounting method as defined in claim 1, wherein said recognizer is fixed, and said mounting head moves against said recognizer while said recognizer captures an image of each of said components for recognizing each of said components.

5. The component mounting method as defined in claim 4, wherein said recognizer is a line camera.

6. A component mounting method comprising:

(a) picking up a plurality of different size components up from a component feeder carriage by a plurality of suction nozzles on a mounting head;

(b) identifying a scanning speed required for recognizing each of said components picked up;

(c) identifying a slowest speed among said plurality of different size components picked up in said scanning speeds;

(d) scanning each of said components integrally against a recognizer disposed on a movement route of said mounting head at said slowest speed by moving said mounting head;

(e) recognizing each of said components during scanning; and (f) mounting each of said components on a mounting target.

* * * * *